US011437517B2

(12) United States Patent
Wu et al.

(10) Patent No.: US 11,437,517 B2
(45) Date of Patent: Sep. 6, 2022

(54) SEMICONDUCTOR STRUCTURES AND METHODS WITH HIGH MOBILITY AND HIGH ENERGY BANDGAP MATERIALS

(71) Applicant: Taiwan Semiconductor Manufacturing Co., Ltd., Hsinchu (TW)

(72) Inventors: Cheng-Hsien Wu, Hsinchu (TW); Chih-Hsin Ko, Fongshan (TW); Clement Hsingjen Wann, Carmel, NY (US)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 125 days.

(21) Appl. No.: 16/913,012

(22) Filed: Jun. 26, 2020

(65) Prior Publication Data
US 2020/0328307 A1 Oct. 15, 2020

Related U.S. Application Data

(60) Division of application No. 16/390,866, filed on Apr. 22, 2019, now Pat. No. 10,727,351, which is a (Continued)

(51) Int. Cl.
*H01L 29/78* (2006.01)
*H01L 29/267* (2006.01)
(Continued)

(52) U.S. Cl.
CPC ...... *H01L 29/7851* (2013.01); *H01L 21/0259* (2013.01); *H01L 21/02636* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 5,828,076 A | 10/1998 | Gossner et al. |
| 7,799,592 B2 | 9/2010 | Lochtefeld |

(Continued)

FOREIGN PATENT DOCUMENTS

| CN | 101189730 A | 5/2008 |
| JP | 2009054705 A | 3/2009 |

(Continued)

OTHER PUBLICATIONS

Korean Office Action and English Translation, Patent Application No. 10-2012-0065162, dated Jul. 23, 2013, 9 pages.

(Continued)

*Primary Examiner* — Tucker J Wright
(74) *Attorney, Agent, or Firm* — Slater Matsil, LLP (57) ABSTRACT

An embodiment is a structure comprising a substrate, a high energy bandgap material, and a high carrier mobility material. The substrate comprises a first isolation region and a second isolation region. Each of first and second isolation regions extends below a first surface of the substrate between the first and second isolation regions. The high energy bandgap material is over the first surface of the substrate and is disposed between the first and second isolation regions. The high carrier mobility material is over the high energy bandgap material. The high carrier mobility material extends higher than respective top surfaces of the first and second isolation regions to form a fin.

20 Claims, 10 Drawing Sheets

Related U.S. Application Data continuation of application No. 15/456,190, filed on Mar. 10, 2017, now Pat. No. 10,269,969, which is a division of application No. 14/598,378, filed on Jan. 16, 2015, now Pat. No. 9,595,614, which is a continuation of application No. 14/460,105, filed on Aug. 14, 2014, now Pat. No. 8,969,156, which is a division of application No. 13/415,339, filed on Mar. 8, 2012, now Pat. No. 8,836,016.

(51) Int. Cl.

| | | |
|---|---|---|
| *H01L 29/10* | (2006.01) | |
| *H01L 29/66* | (2006.01) | |
| *H01L 21/02* | (2006.01) | |
| *H01L 29/778* | (2006.01) | |
| *H01L 21/762* | (2006.01) | |
| *H01L 21/8252* | (2006.01) | |
| *H01L 29/06* | (2006.01) | |
| *H01L 29/205* | (2006.01) | |

(52) U.S. Cl.
CPC .. *H01L 21/02639* (2013.01); *H01L 21/02658* (2013.01); *H01L 21/76224* (2013.01); *H01L 21/8252* (2013.01); *H01L 29/0649* (2013.01); *H01L 29/1037* (2013.01); *H01L 29/1054* (2013.01); *H01L 29/205* (2013.01); *H01L 29/267* (2013.01); *H01L 29/66462* (2013.01); *H01L 29/66522* (2013.01); *H01L 29/66795* (2013.01); *H01L 29/7786* (2013.01); *H01L 29/785* (2013.01); *H01L 29/7842* (2013.01); *H01L 29/7848* (2013.01)

(58) Field of Classification Search
CPC ......... H01L 27/10826; H01L 27/10879; H01L 27/1211; H01L 29/41791; H01L 29/66795–66818; H01L 29/785–7856; H01L 29/1037; H01L 2924/13067; H01L 29/04–045; H01L 29/16–1608
See application file for complete search history.

(56) References Cited

U.S. PATENT DOCUMENTS

| | | |
|---|---|---|
| 8,062,963 B1 | 11/2011 | van Dal |
| 8,836,016 B2 | 9/2014 | Wu et al. |
| 8,941,153 B2 | 1/2015 | Lee et al. |
| 2008/0073667 A1* | 3/2008 | Lochtefeld .......... H01L 29/7851 257/190 |
| 2008/0099785 A1 | 5/2008 | Bai et al. |
| 2008/0210290 A1 | 9/2008 | Wu et al. |
| 2009/0065047 A1 | 3/2009 | Fiorenza et al. |
| 2009/0072276 A1 | 3/2009 | Inaba |
| 2010/0015768 A1 | 1/2010 | Jang et al. |
| 2010/0301390 A1 | 12/2010 | Ko et al. |
| 2011/0049613 A1 | 3/2011 | Yeh et al. |
| 2011/0073952 A1 | 3/2011 | Kwok et al. |
| 2011/0193175 A1 | 8/2011 | Huang et al. |
| 2012/0319211 A1 | 12/2012 | van Dal et al. |
| 2013/0001591 A1 | 1/2013 | Wu et al. |
| 2013/0049068 A1 | 2/2013 | Lin et al. |
| 2013/0228875 A1 | 9/2013 | Lee et al. |

FOREIGN PATENT DOCUMENTS

| | | |
|---|---|---|
| KR | 20100129146 A | 12/2010 |
| KR | 20110025075 A | 3/2011 |

OTHER PUBLICATIONS

"Facet", Merriam-Webster.com, Merriam-Webster, n.d. Web. Mar. 18, 2014. <http://www.merriam-webster.com/dictionary/facet>.

Yamahata, S., et al., "InP/InGaAs Collector-UP Heterojunction Bipolar Transistors Fabricated Using Fe-ION-Implantation," Indium Phosphide and Related Materials, Conference Proceedings, Seventh International Conference, May 9, 1995., pp. 652-655.

\* cited by examiner

SEMICONDUCTOR STRUCTURES AND METHODS WITH HIGH MOBILITY AND HIGH ENERGY BANDGAP MATERIALS

PRIORITY CLAIM AND CROSS-REFERENCE

This application is a divisional of U.S. patent application Ser. No. 16/390,866, filed on Apr. 22, 2019, entitled "Semiconductor Structures and Methods with High Mobility and High Energy Bandgap Materials," now U.S. Pat. No. 10,727,351 issued on Jul. 28, 2020, which is a continuation of U.S. patent application Ser. No. 15/456,190, filed on Mar. 10, 2017, entitled "Semiconductor Structures and Methods with High Mobility and High Energy Bandgap Materials," now U.S. Pat. No. 10,269,969 issued on Apr. 23, 2019, which is a divisional of U.S. patent application Ser. No. 14/598,378, filed on Jan. 16, 2015, entitled "Semiconductor Structures and Methods with High Mobility and High Energy Bandgap Materials," now U.S. Pat. No. 9,595,614 issued on Mar. 14, 2017, which is a continuation of U.S. patent application Ser. No. 14/460,105, filed on Aug. 14, 2014, entitled "Semiconductor Structures and Methods with High Mobility and High Energy Bandgap Materials," now U.S. Pat. No. 8,969,156 issued on Mar. 5, 2015, which is a divisional of U.S. patent application Ser. No. 13/415,339, filed on Mar. 8, 2012, entitled "Semiconductor Structures and Methods with High Mobility and High Energy Bandgap Materials," now U.S. Pat. No. 8,836,016 issued on Sep. 16, 2014, which applications are hereby incorporated herein by reference in their entireties.

BACKGROUND

With the increasing down-scaling of integrated circuits and increasingly demanding requirements to the speed of integrated circuits, transistors need to have higher drive currents with smaller dimensions. Fin Field-Effect Transistors (finFETs) were thus developed. FinFETs generally have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the finFETs are increased.

In an existing finFET formation process, shallow trench isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 8B are a method of forming a fin field effect transistor (finFET) according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely fin field effect transistors (finFETs) and methods for forming finFETs. Other embodiments may also be applied, however, to planar transistors or other devices. Although embodiments of methods for forming finFETs are disclosed with steps performed in a particular order, embodiments contemplate methods in which steps are performed in any logical order.

Figure 1:
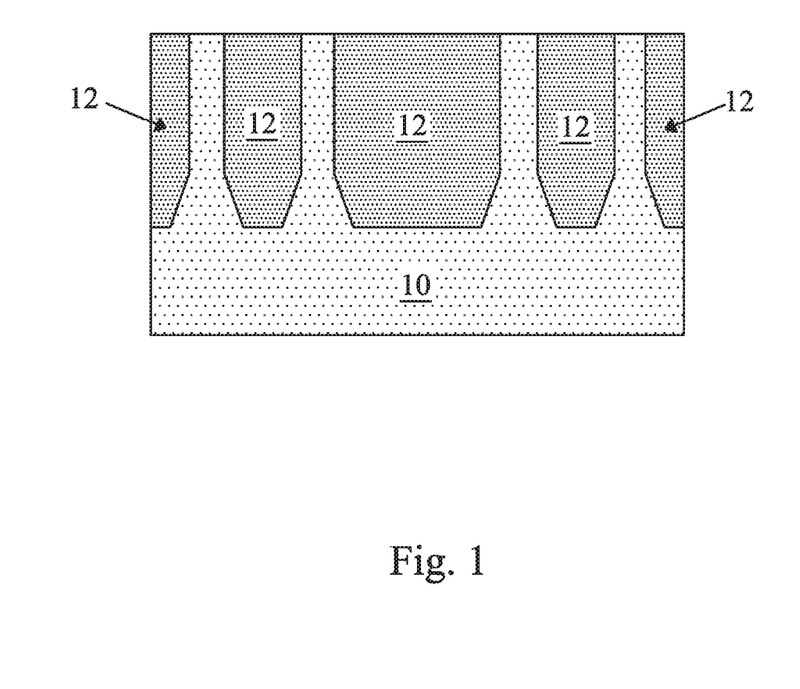

FIG. 1 illustrates a substrate 10 with isolation regions 12. The substrate 10, in this embodiment, is a bulk silicon substrate, and in other embodiments can be a bulk semiconductor substrate, such as germanium or the like, a semiconductor on insulator (SOI), or the like. The isolation regions 12, in this embodiment, are each a trench oxide formed, for example, by etching trenches and filling the trenches with silicon oxide using a high density plasma chemical vapor deposition (HDP-CVD). The isolation regions 12 define subsequently formed active regions, such as fins for finFETs. Top surfaces of the substrate 10 between adjacent isolation regions 12 can be rectangular, oval, or the like. Other acceptable methods and materials for forming isolation regions 12 may also be used.

Figure 2:
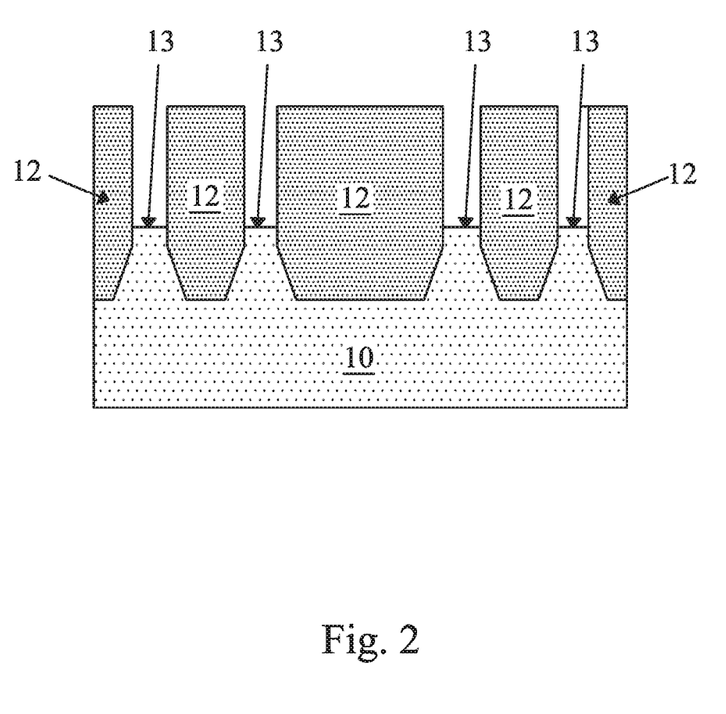

FIG. 2 illustrates the substrate 10 having recessed surfaces 13 between the isolation regions 12. In this embodiment, each recessed surface 13 is a singular planar surface and is at a depth, for example, between approximately 40 nm and approximately 100 nm from a top surface of an adjacent isolation region 12. The substrate 10 can be recessed by anisotropically etching the substrate 10 using an etchant with a selectivity that etches the substrate 10 and substantially not the isolation regions 12. The isolation regions 12 extend to a depth below the recessed surfaces, for example, between approximately no nm and approximately 150 nm. Each recessed surface 13 is a crystalline surface of the substrate 10, such as a surface of a monocrystalline semiconductor material of the substrate 10.

Figure 3:
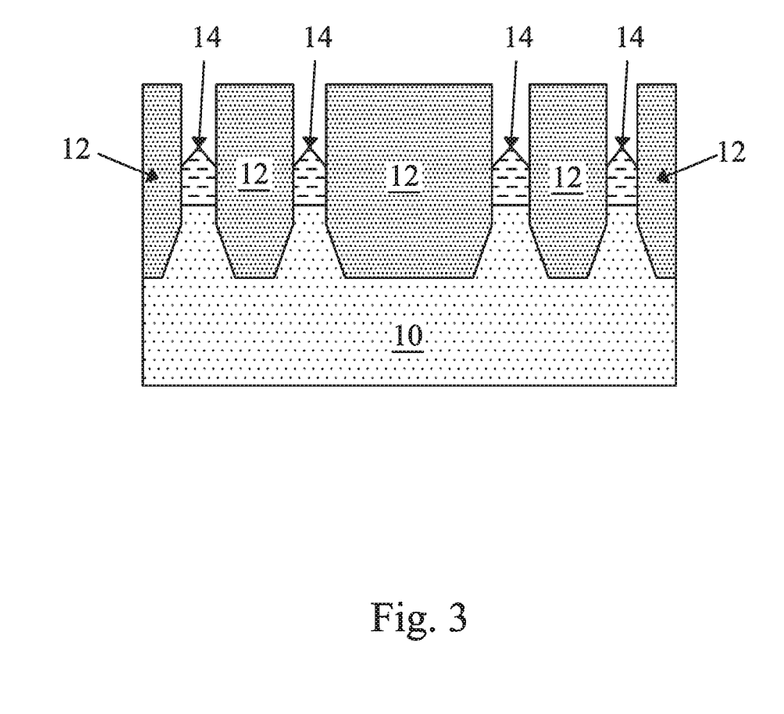

FIG. 3 shows the epitaxial growth of a high energy bandgap material 14 on the recessed surfaces 13 of the substrate 10 between the isolation regions 12. The high energy bandgap material 14 can have an energy bandgap, for example, greater than 1 eV. Example high energy bandgap materials include InP, InGaP, AlInAs, AlAs, GaAs, GaP, the like, or a combination thereof. The high energy bandgap material 14 is, for example, a crystalline semiconductor material formed by selective epitaxial growth (SEG). Top surfaces of the high energy bandgap material 14 can include facets such as illustrated, can be planar, or can have a planar surface and facets, which can be formed by controlling appropriate process parameters during the epitaxial growth. The high energy bandgap material 14 can also include defects that arise from a mismatch of lattices between the crystalline materials of the substrate 10 and the high energy bandgap material 14. The high energy bandgap material 14 can have a thickness greater than its critical thickness and can be fully relaxed. For example, the high energy bandgap material 14 can have a thickness between approximately 10 nm and approximately 60 nm. The high energy bandgap material 14 can be selected to cause a desired stress, such as tensile or compressive, in a material subsequently grown over the high energy bandgap material 14.

Figure 4:
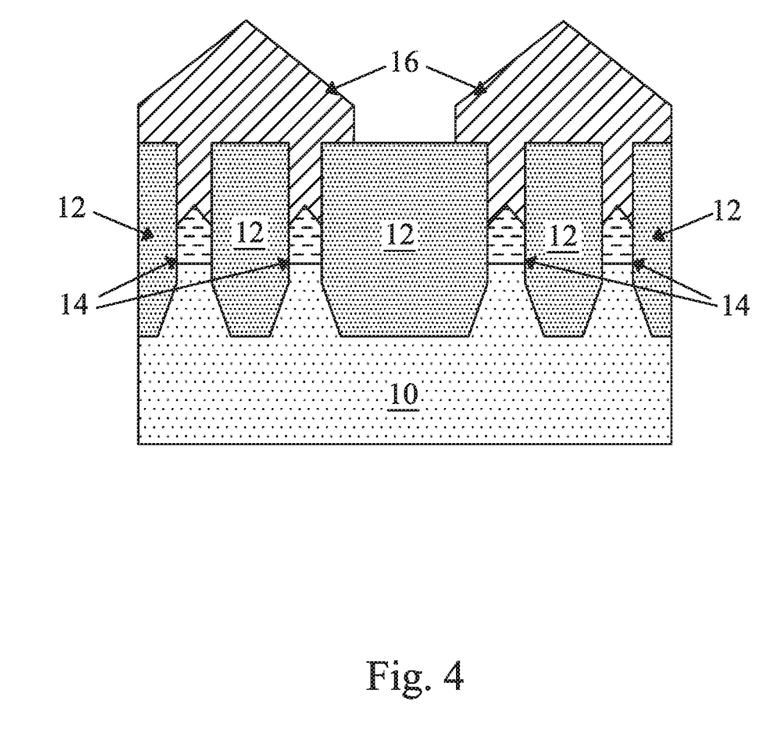

FIG. 4 shows the epitaxial growth of a high carrier mobility material 16 on the high energy bandgap material 14 and in the recesses between the isolation regions 12. An electron mobility of the high carrier mobility material 16 can be greater than approximately 8,500 cm$^2$/V-s in embodiments where n-type devices, such as n-type finFETs, are to be formed. A hole mobility of the high carrier mobility material 16 can be greater than approximately 1,500 cm$^2$/V-s in embodiments where p-type devices, such as p-type fin FETs, are to be formed. The high carrier mobility material 16 can include a stress, such as tensile or compressive, which can change a carrier mobility of the high carrier mobility material 16. The stress can be induced in the high carrier mobility material 16 by a mismatch of crystalline lattice spacing between the high carrier mobility material 16 and the adjoining underlying material, which is the high energy bandgap material 14 in this embodiment. Other layers can be disposed between the high energy bandgap material 14 and the high carrier mobility material 16.

Example high carrier mobility materials include InAs, InSb, InGaAs, InAsSb, InGaSb, SiGe, Ge, the like, or a combination thereof. In embodiments, InAs, InSb, InGaAs, InAsSb, InGaSb, or the like can be used for an n-type finFET, and $Si_{1-x}Ge_x$, where x>0.5, can be used for a p-type finFET. The high carrier mobility material 16 is, for example, a monocrystalline semiconductor material formed by SEG. The high carrier mobility material 16 is grown to fill the recesses between the isolation regions 12. The high carrier mobility material 16 can cover portions of the isolation regions 12 and can coalesce from out of multiple recesses over an isolation region 12.

Figure 5:
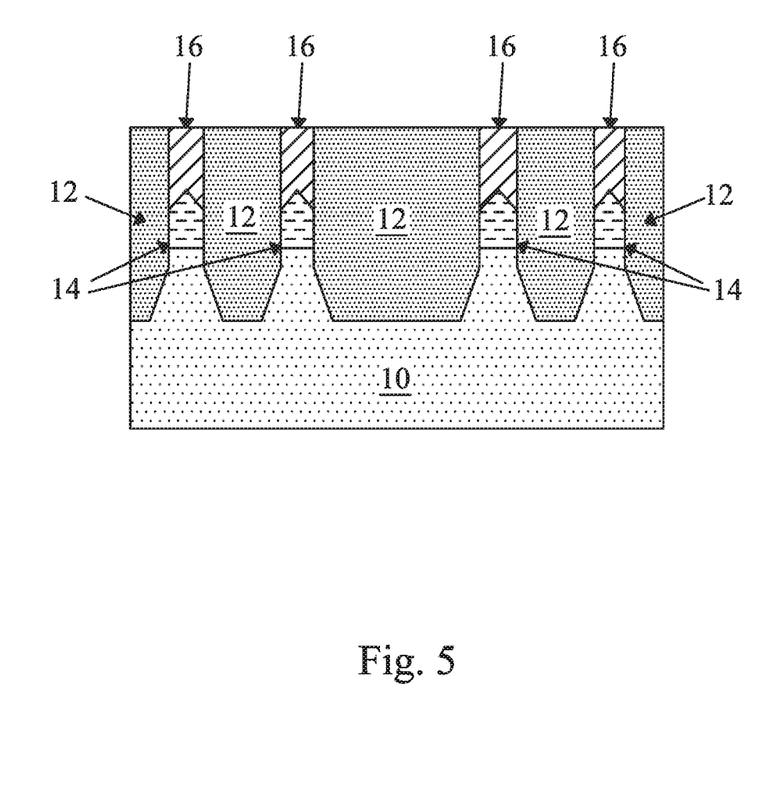

In FIG. 5, a planarization process is performed to remove portions of the high carrier mobility material 16 from above top surfaces of the isolation regions 12. A chemical mechanical polish (CMP) can be used as the planarization process. The isolation regions 12 and the high carrier mobility material 16 have top surfaces that are co-planar.

Figure 6:
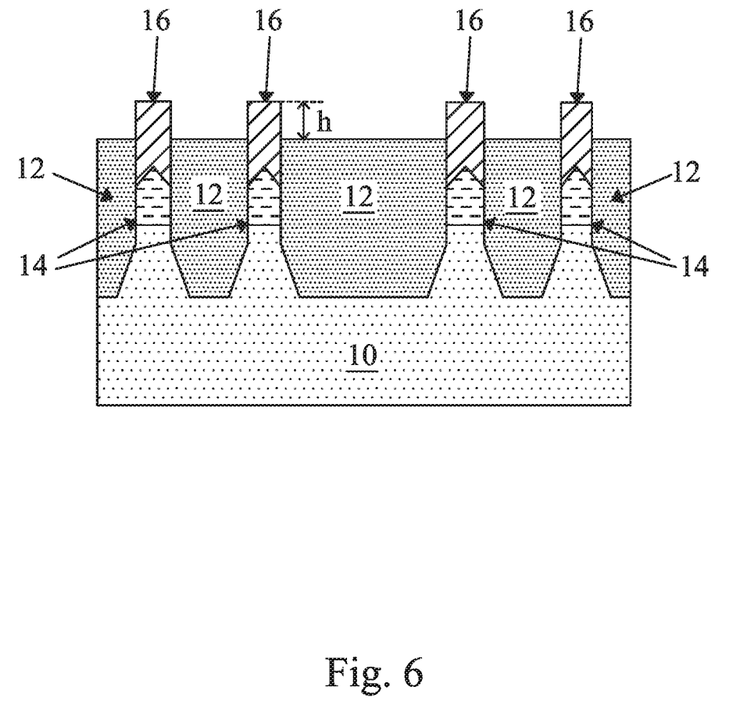

FIG. 6 shows the isolation regions 12 recessed using, for example, an etch selective to the isolation regions 12. The recessing of the isolation regions 12 results in fins extending a height h above top surfaces of the isolation regions 12. The height h is less than the distance the high carrier mobility material 16 extends along a sidewall such that a lower sidewall portion of the high carrier mobility material 16 is covered by an adjacent isolation region 12. In this manner, the high energy bandgap material 14 in the sidewall is covered by an adjacent isolation region 12, and the high carrier mobility material 16 can serve as a channel in the fin along exposed exterior surfaces of the fin.

Figure 7A:
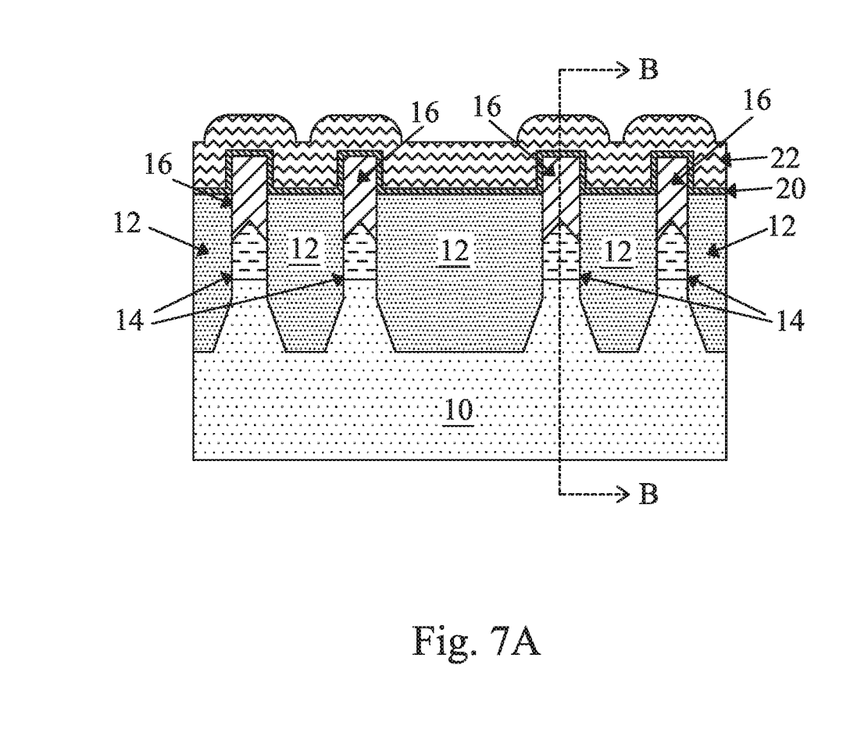
Figure 7B:
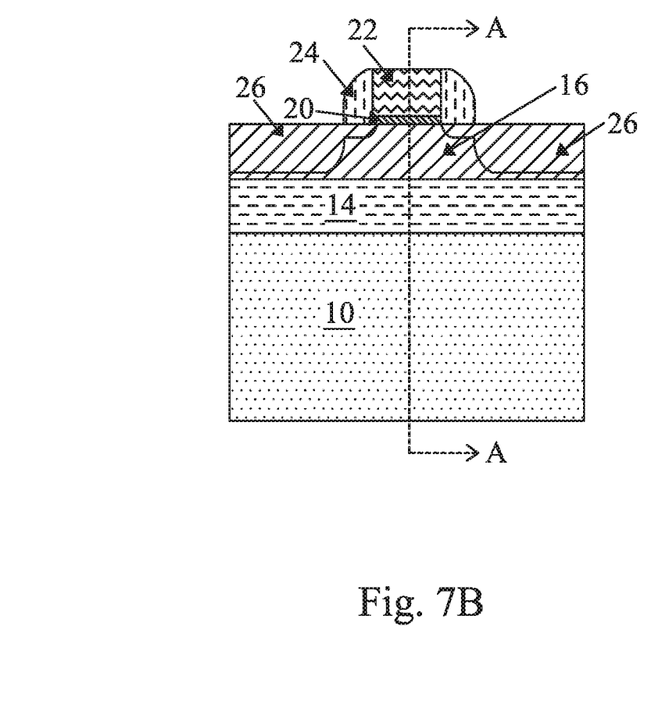

FIGS. 7A and 7B illustrate cross sectional views of the formation of a gate structure and source/drain regions 26. FIG. 7B is a cross sectional view of FIG. 7A along line B-B, and FIG. 7A is a cross sectional view of FIG. 7B along line A-A. In these figures, a gate dielectric layer and gate electrode layer are sequentially and conformally deposited over the fins and the isolation regions 12, such as by CVD, atomic layer deposition (ALD), the like, or a combination thereof. The gate dielectric layer and gate electrode layer are then patterned into a gate dielectric 20 and a gate electrode 22 using, for example, acceptable photolithography techniques. The gate dielectric 20 can comprise any acceptable dielectric material, and the gate electrode 22 can comprise any acceptable conductive material, such as polysilicon, a metal, a silicide, or the like.

Extension regions of the source/drain regions 26 are then formed in the high carrier mobility material 16. The extension regions can be implanted into the high carrier mobility material 16, e.g., the fin, using an acceptable implantation of a p-type or n-type dopant according to the application. Gate spacers 24 are then formed. A gate spacer dielectric layer is deposited conformally, such as by CVD, ALD, the like, or a combination thereof, over the substrate 10, including over the gate electrode 22 and gate dielectric 20 and along their sidewalls. Portions of the gate spacer dielectric layer are removed such that gate spacers 24 remain, such as by an anisotropic etch. The gate spacers 24 can be any acceptable material, such as silicon nitride or the like. After forming the gate spacers 24, the deep drain/source regions 26 are formed, for example, by an acceptable implantation into the high carrier mobility material 16, e.g., the fin, using a p-type or n-type dopant according to the application.

Figure 8A:
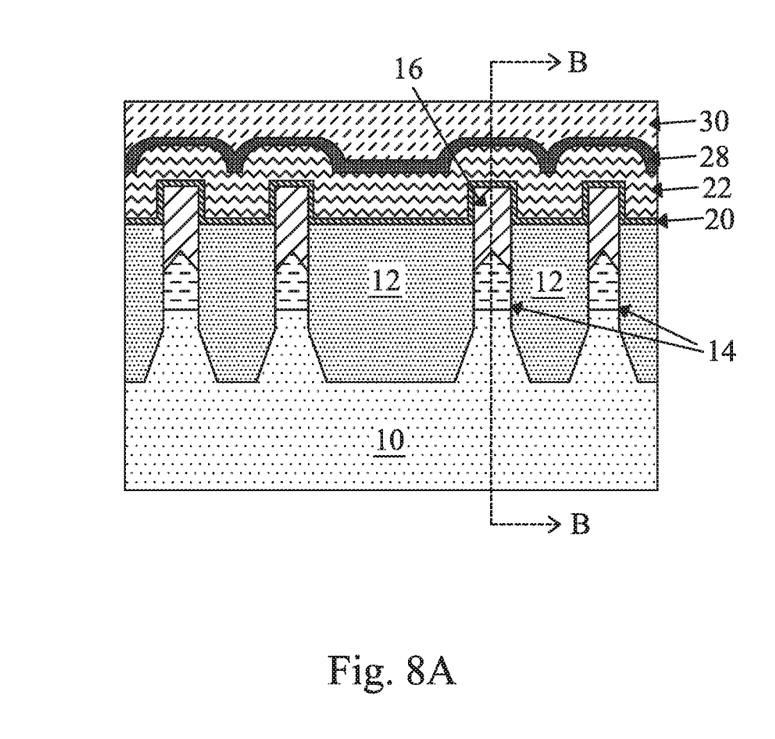
Figure 8B:
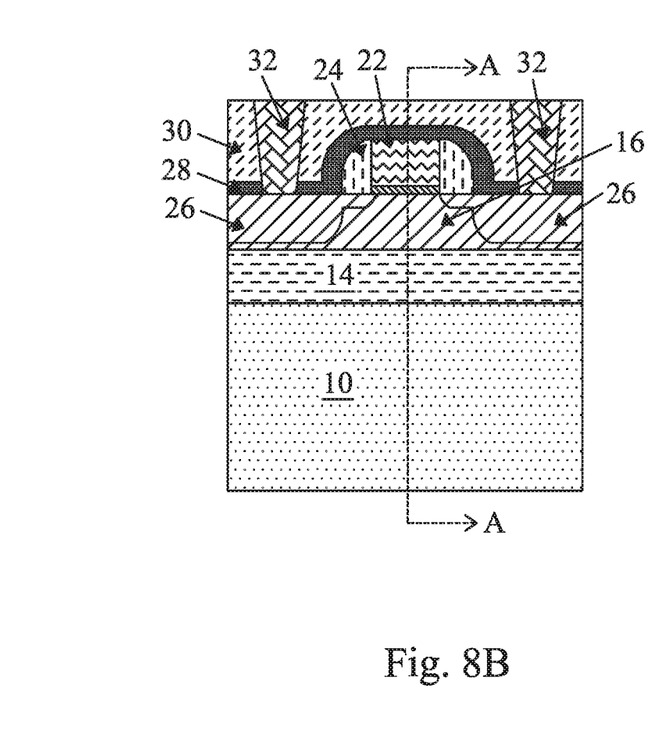

FIGS. 8A and 8B are cross sectional views of the formation of an etch stop layer (ESL) 28, an inter-layer dielectric (ILD) 30 and contacts 32. The ESL 28 is deposited over the substrate 10, fins, and gate structures by an acceptable deposition process, such as CVD, ALD, or the like. The ESL 28 can be any acceptable material, such as silicon nitride or the like. The ILD 3o is deposited over the ESL 28 by an acceptable deposition process, such as CVD, ALD, or the like. The ILD 30 can be planarized, such as by a CMP. The ILD 30 can be any acceptable material, such as silicon oxide, borophosphosilicate glass (BPSG), phosphosilicate glass (PSG), the like, or a combination thereof. Contact openings are then etched in the ILD 30 and ESL 28 to the source/drain regions 26 using, for example, a photolithography process. Conductive materials, such as a metal, doped polysilicon, or the like, are deposited in the contact openings. A CMP can be used to remove any excess conductive materials. The remaining conductive materials in the contact openings form the contacts 32.

Figure 9:
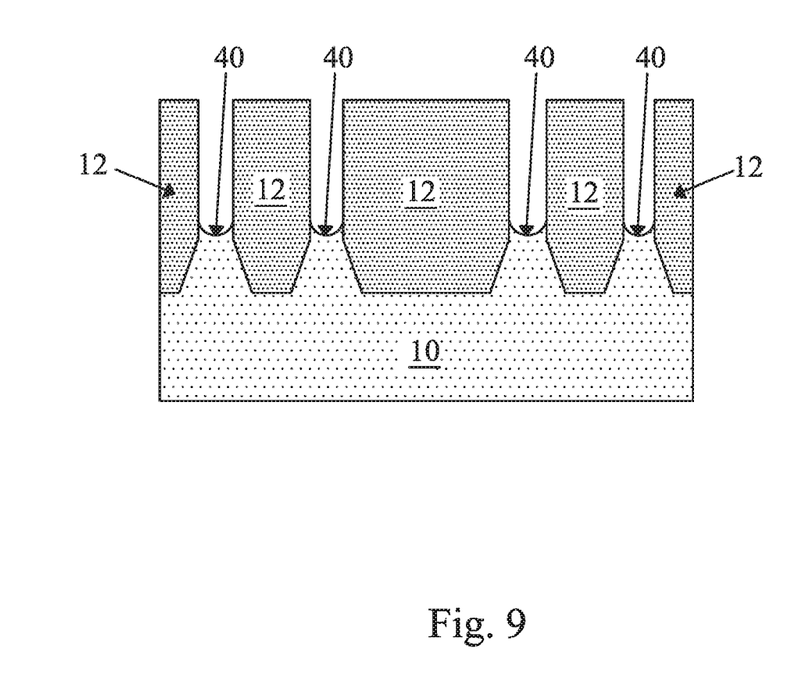
FIG. 9 is an example of recessed surfaces that can be substituted into the method of FIGS. 1 through 8B according to an embodiment.
Figure 10:
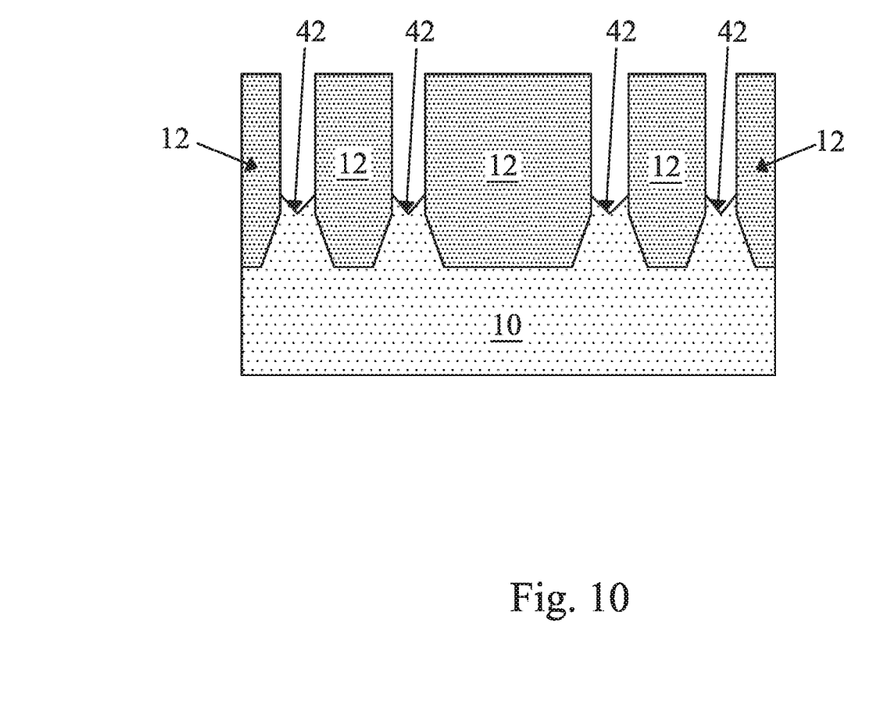
FIG. 10 is another example of recessed surfaces that can be substituted into the method of FIGS. 1 through 8B according to an embodiment.

FIGS. 9 and 10 illustrate different recessed surfaces 40 and 42, respectively, which can be used in the place of the recessed surfaces 13 of FIG. 2. In FIG. 9, the recessed surfaces 40 are curved surfaces, such as meniscus-type surfaces, between adjacent isolation regions 12. The curved surfaces of the recessed surfaces 40 can be formed by using, for example, an isotropic etch where a mask or photoresist covers portions of the substrate 10 adjoining the isolation regions 12. An example isotropic etch includes a plasma dry etch. In FIG. 10, the recessed surfaces 42 are faceted between adjacent isolation regions 12. The faceted surfaces of the recessed surfaces 42 can be formed using an etch that is selective to appropriate crystalline surfaces of the substrate 10. For example, the crystalline surfaces can be adjacent {111} planes, with an included angle of 70.5, which can be formed by a wet etch using potassium hydroxide (KOH), tetramethylammonium hydroxide (TMAH), ammonium hydroxide ($NH_4OH$), or the like. The recessed surfaces 40 or 42 of FIG. 9 or 10 can be substituted in the process and structure previously discussed.

Embodiments can achieve advantages. By including the high energy bandgap material between the fin and the substrate, a leakage current can be reduced. The high energy bandgap material may require a higher energy for carriers to travel to the underlying substrate from the device in the fin, which can reduce leakage current. Further, by appropriately selecting the material used as the high energy bandgap material, a stress can be caused in the high carrier mobility material of the fin increasing the carrier mobility of the fin and corresponding device.

An embodiment is a structure comprising a substrate, a high energy bandgap material, and a high carrier mobility material. The substrate comprises a first isolation region and a second isolation region. Each of first and second isolation regions extends below a first surface of the substrate between the first and second isolation regions. The high energy bandgap material is over the first surface of the substrate and is disposed between the first and second isolation regions. The high carrier mobility material is over the high energy bandgap material. The high carrier mobility material extends higher than respective top surfaces of the first and second isolation regions to form a fin.

Another embodiment is a structure comprising a semiconductor substrate, a first semiconductor material on the substrate, and a fin comprising a second semiconductor material on the first semiconductor material. The first semiconductor material is disposed between the semiconductor substrate and the second semiconductor material. The first semiconductor material has an energy bandgap greater than 1 eV. The second semiconductor material has an electron mobility greater than 8,500 $cm^2/V$-s or a hole mobility greater than 1,500 $cm^2/V$-s.

A further embodiment is a method for forming a structure. The method comprises epitaxially growing a first semiconductor material on a semiconductor substrate. The semiconductor substrate includes a first isolation region and a second isolation region extending to a depth below a first surface of the semiconductor substrate. The first surface is between the first isolation region and the second isolation region. The first isolation region and the second isolation region extend higher than the first surface of the semiconductor substrate. The method further comprises forming a fin extending higher than the first isolation region and the second isolation region. Forming the fin includes epitaxially growing a second semiconductor material on the first semiconductor material. The first semiconductor material has a bandgap energy greater than 1 eV, and the second semiconductor material has a hole mobility greater than 1,500 $cm^2/V$-s or an electron mobility greater than 8,500 $cm^2/V$-s.

A further embodiment is a structure including a fin having at least one source/drain region in a high carrier mobility material. The high carrier mobility material is over a high energy bandgap material. The high energy bandgap material is over a substrate. The high energy bandgap material has a thickness greater than a critical thickness for the high energy bandgap material. A gate structure includes a gate dielectric on a sidewall surface of the fin and a gate electrode on the gate dielectric.

A further embodiment is a structure including a substrate, a gate structure over the substrate and a high carrier mobility material on opposing sides of the gate structure. The high carrier mobility material is over a high energy bandgap material. The high energy bandgap material is over the substrate. A surface of the substrate interfacing with the high energy bandgap material is non-planar.

A further embodiment is a method including forming a high energy bandgap material on a substrate and in a recess. The high energy bandgap material has a thickness greater than a critical thickness for the high energy bandgap material. The method further includes forming a high carrier mobility material over the high energy bandgap material and at least partially in the recess and causing at least a portion of the high carrier mobility material to protrude to form a fin.

A further embodiment is a method including forming one or more dielectric layers over a substrate, the one or more dielectric layers having a recess, wherein the recess exposes a portion of the substrate; forming a high energy bandgap material on the substrate in the recess, the high energy bandgap material having a thickness greater than a critical thickness for the high energy bandgap material; forming a high carrier mobility material over the high energy bandgap material, the high carrier mobility material extending into the recess; and causing at least a portion of the high carrier mobility material to protrude from the one or more dielectric layers to form a first fin.

A further embodiment is a method including forming a high energy bandgap material on a portion of a substrate between a first isolation region and a second isolation region; forming a high carrier mobility material on the high energy bandgap material, the high energy bandgap material including InP, InGaP, AlInAs, AlAs, GaAs, or GaP; planarizing the high carrier mobility material to be level with top surfaces of the first isolation region and the second isolation region; and recessing the first isolation region and the second isolation region to form a fin, the fin including the high energy bandgap material.

A further embodiment is a method including epitaxially growing a first semiconductor material on a semiconductor substrate, the epitaxially growing the first semiconductor material forming facets on the first semiconductor material, the semiconductor substrate having a first isolation region and a second isolation region thereon, wherein at least a portion of the semiconductor substrate extends between the first isolation region and the second isolation region, the first isolation region and the second isolation region extending above a first surface of the semiconductor substrate, the first surface being between the first isolation region and the second isolation region; epitaxially growing a second semiconductor material on the first semiconductor material, the second semiconductor material being a monocrystalline semiconductor material including In; forming a fin by recessing the first isolation region and the second isolation region to a depth below a top surface of the second semiconductor material; and forming a gate structure over the fin.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a first fin protruding from a substrate;
    forming one or more dielectric layers over the substrate along opposing sides of the first fin;
    recessing the first fin to form a recess, wherein the recess exposes a portion of the substrate;

forming a high energy bandgap material on the substrate in the recess, the high energy bandgap material having a thickness greater than a critical thickness for the high energy bandgap material;

forming a high carrier mobility material over the high energy bandgap material, the high carrier mobility material extending into the recess; and causing at least a portion of the high carrier mobility material to protrude from the one or more dielectric layers to form a second fin.

2. The method of claim 1, wherein the high energy bandgap material is formed by epitaxial growth.

3. The method of claim 1, wherein recessing the first fin comprises an isotropic etch.

4. The method of claim 1, wherein recessing the first fin comprises etching using an etchant that is selective to crystalline surfaces of the substrate.

5. The method of claim 4, wherein etching comprises wet etching using potassium hydroxide (KOH), tetramethylammonium hydroxide (TMAH), or ammonium hydroxide (NH$_4$OH).

6. The method of claim 4, wherein the crystalline surfaces are adjacent {111} planes.

7. The method of claim 6, wherein the adjacent {111} planes have an included angle of 70.5.

8. The method of claim 1, further comprising forming a gate structure on the second fin.

9. The method of claim 1, wherein the high energy bandgap material comprises InP, InGaP, AlInAs, AlAs, GaAs, or GaP.

10. The method of claim 1, wherein the high carrier mobility material comprises InAs, InSb, InGaAs, InAsSb, InGaSb, SiGe, or Ge.

11. A method comprising:

forming a high energy bandgap material on a portion of a substrate between a first isolation region and a second isolation region, wherein the first isolation region and the second isolation region extend below a surface of the portion of the substrate;

forming a high carrier mobility material on the high energy bandgap material, the high energy bandgap material comprising InP, InGaP, AlInAs, AlAs, GaAs, or GaP;

planarizing the high carrier mobility material to be level with top surfaces of the first isolation region and the second isolation region; and recessing the first isolation region and the second isolation region to form a fin, the fin comprising the high energy bandgap material.

12. The method of claim 11, wherein forming the high energy bandgap material comprises performing a selective epitaxial growth process, wherein the high energy bandgap material comprises a crystalline semiconductor material.

13. The method of claim 11, wherein the high energy bandgap material has an energy bandgap greater than 1 eV.

14. The method of claim 11, wherein top surfaces of the high energy bandgap material comprise facets.

15. The method of claim 11, wherein the high energy bandgap material has a thickness between 10 nm and 60 nm.

16. The method of claim 11, wherein an electron mobility of the high carrier mobility material is greater than 8,500 cm$^2$/V-s.

17. A method comprising:

epitaxially growing a first semiconductor material on a semiconductor substrate, the epitaxially growing the first semiconductor material forming facets on the first semiconductor material, the semiconductor substrate having a first isolation region and a second isolation region thereon, wherein at least a portion of the semiconductor substrate extends between the first isolation region and the second isolation region, the first isolation region and the second isolation region extending above a first surface of the semiconductor substrate, the first surface being between the first isolation region and the second isolation region, the first isolation region and the second isolation region extending to a depth below the first surface in a range of 110 nm and 150 nm;

epitaxially growing a second semiconductor material on the first semiconductor material, the second semiconductor material being a monocrystalline semiconductor material comprising In;

forming a fin by recessing the first isolation region and the second isolation region to a depth below a top surface of the second semiconductor material; and forming a gate structure over the fin.

18. The method of claim 17, wherein the first surface is a singular planar surface.

19. The method of claim 17, wherein the first surface is at a depth in a range of 40 nm and 100 nm from a top surface of the first isolation region.

20. The method of claim 17, wherein the first surface is rectangular or oval.

* * * * *